(12) United States Patent
Castro et al.

(10) Patent No.: US 11,121,712 B1
(45) Date of Patent: Sep. 14, 2021

(54) LEVEL SHIFTERS WITH VARIABLY ADJUSTED CONTROL VOLTAGE AND FOR READING MEMORY CELLS

(71) Applicant: Infineon Technologies AG, Neubiberg (DE)

(72) Inventors: Leonardo Castro, Munich (DE); Rainer Bartenschlager, Kaufbeuren (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/818,153

(22) Filed: Mar. 13, 2020

(51) Int. Cl.
 *G11C 16/30* (2006.01)
 *G11C 16/10* (2006.01)
 *H03K 19/0185* (2006.01)
 *G11C 7/06* (2006.01)

(52) U.S. Cl.
 CPC ....... *H03K 19/018521* (2013.01); *G11C 7/06* (2013.01); *G11C 16/10* (2013.01); *G11C 16/30* (2013.01)

(58) Field of Classification Search
 CPC ................ G11C 7/06; H03K 19/018521
 USPC ...................................... 365/189.11
 See application file for complete search history.

(56) References Cited

U.S. PATENT DOCUMENTS

| | | | | |
|---|---|---|---|---|
| 5,949,721 A * | 9/1999 | Kwon | ............... | G11C 7/1057 365/189.11 |
| 2004/0090246 A1* | 5/2004 | Gans | ............... | G11C 7/08 327/57 |
| 2008/0049540 A1* | 2/2008 | Jeong | ............... | G11C 7/1069 365/233.1 |
| 2014/0176221 A1* | 6/2014 | Lin | ............... | G11C 7/062 327/333 |
| 2014/0185367 A1* | 7/2014 | Ngo | ............... | G11C 11/4074 365/154 |
| 2017/0162132 A1* | 6/2017 | Yamashita | ............... | G09G 3/36 |

* cited by examiner

*Primary Examiner* — Ly D Pham
(74) *Attorney, Agent, or Firm* — Cooper Legal Group, LLC

(57) ABSTRACT

A level shifter device comprises a first stage level shifter configured to transform an input signal to a first output signal having a voltage between at least one of a VPS control voltage and a ground or a VDD supply voltage and a VNS control voltage. The level shifter device comprises a second stage level shifter arranged subsequent to the first stage level shifter and configured to transform the first output signal to a second output signal having a voltage between the ground and the VDD supply voltage.

25 Claims, 7 Drawing Sheets

LEVEL SHIFTERS WITH VARIABLY ADJUSTED CONTROL VOLTAGE AND FOR READING MEMORY CELLS

TECHNICAL FIELD

The present disclosure relates to the field of level shifters and sense amplifiers.

BACKGROUND

One type of device that may be utilized within a circuit is a level shifter, such as a voltage translator, that can be used to translate a voltage from one voltage domain to a different voltage domain. For example, a first circuit, such as a processor, may operate at a 3.3V voltage and a second circuit, such as a sensor, may operate at a 5V voltage. Because the first circuit and the second circuit operate at different voltage domains, the first circuit and the second circuit may be incompatible. Accordingly, a level shifter can be used to shift the 5V voltage used by the sensor to the 3.3V used by the processor so that the processor can receive sensor data from the sensor at the 3.3V voltage operating domain of the processor. A simple level shifter may utilize a transistor and a resistor, such as an NMOS transistor and pull up resistor or a PMOS transistor and a pull down resistor, to shift the voltage.

Another type of device that may be utilized within a circuit is a sense amplifier to read data from cells of a memory device. The sense amplifier is used to distinguish between states that could be stored by a cell. In an example, a state of the cell may be represented by a modulation of current flowing through the cell, such that the sense amplifier detects a difference in the current through a bitline that connects the sense amplifier to a row comprising the cell. In this way, the state of the cell corresponds to a modulation of the current flow.

Due to manufacturing variability and extrinsic effects such as externally induced noise, a current state of the cell detected by the sense amplifier may not exactly match a possible state of the cell. Additionally, the memory device may comprise significantly more than one sense amplifier, and thus manufacturing variability of the sense amplifiers themselves, both within a sense amplifier and across all sense amplifiers within a production lifetime, would have to be taken into account in order to accurately determine a state of a cell. A read window is a range of values between two cell states. The sense amplifier operates within the read window, which unfortunately becomes smaller with increase variability. Thus, the ability of the sense amplifier to correctly determine a state of a cell diminishes when all of the source of variability cannot be accounted.

Some sense amplifiers that operate under the principle of current detection may employ current mirrors to improve the accuracy of sense amplifiers to detect states of cells. However, each current mirror contributes significantly to circuit variability due to transistor mismatch. Offset cancellation could be employed to reduce such circuit variability, but offset cancellation adds complexity, area, and increased power consumption. Further, the use of current mirrors can make current consumption prohibitively high for many use cases.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, a level shifter device is provided. The level shifter device comprises a first stage level shifter configured to transform an input signal, from a bitline connected to at least one memory cell of a memory device, to a first output signal having a voltage between at least one of a VPS control voltage and a ground or a VDD supply voltage and a VNS control voltage. The level shifter device comprises a second stage level shifter arranged subsequent to the first stage level shifter and configured to transform the first output signal to a second output signal having a voltage between the ground and the VDD supply voltage.

In an embodiment of the techniques presented herein, a level shifter device is provided. The level shifter device comprises a first stage level shifter configured to transform an input signal to a first output signal having a voltage between at least one of a VPS control voltage and a ground or a VDD supply voltage and a VNS control voltage. The level shifter device comprises a second stage level shifter arranged subsequent to the first stage level shifter and configured to transform the first output signal to a second output signal having a voltage between the ground and the VDD supply voltage. At least one of the VPS control voltage or the VNS control voltage is variably adjusted.

In an embodiment of the techniques presented herein, a method is provided. The method includes controlling a first stage level shifter to transform an input signal to output a first output signal having a voltage between at least one of a VPS control voltage and a ground or a VDD supply voltage and a VNS control voltage. The method includes controlling a second stage level shifter, arranged subsequent to the first stage level shifter, to transform the first output signal to a second output signal having a voltage between the ground and the VDD supply voltage.

In an embodiment of the techniques presented herein, an apparatus is provided. The apparatus includes a means for controlling a first stage level shifter to transform an input signal to output a first output signal having a voltage between at least one of a VPS control voltage and a ground or a VDD supply voltage and a VNS control voltage. The apparatus includes a means for controlling a second stage level shifter, arranged subsequent to the first stage level shifter, to transform the first output signal to a second output signal having a voltage between the ground and the VDD supply voltage.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
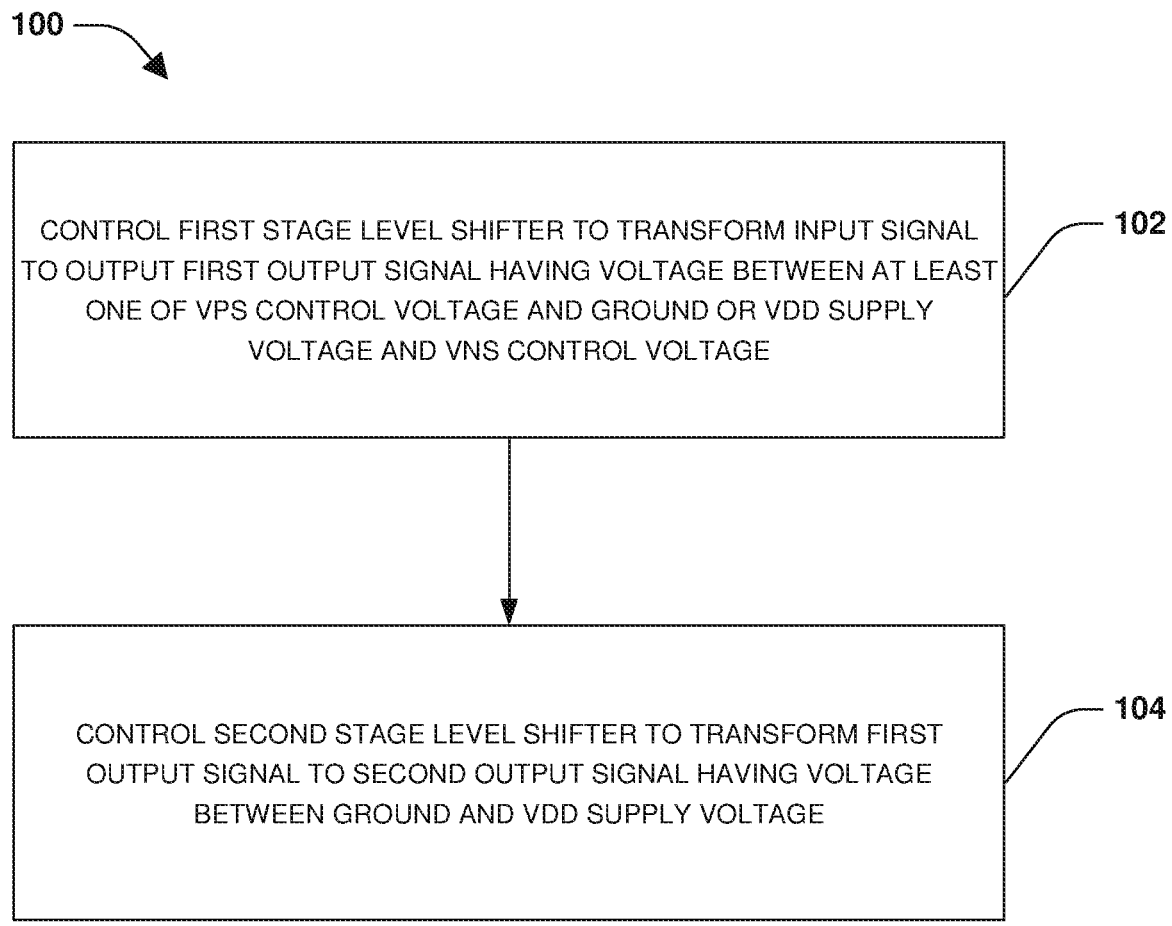
FIG. 1 is an illustration of an example method of operating a level shifter in accordance with the techniques presented herein.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Within the field of electronics, various types of devices may be utilized to perform various functions. One example is a level shifter. The level shifter can be used to shift/translate signals from one voltage domain to another different voltage domain. This allows two components, such as a processor and a sensor, that are otherwise incompatible due to operating in different voltage domains to exchange signals that are shifted by the level shifter to an appropriate voltage domain.

Another type of device is a sensing device, such as a sense amplifier, that is used to determine the states of cells within a memory device, which may individually represent one or more states, such as a logical "1", a logical "0", or any other state. The sensing device may be implemented for any type of memory device, such as a non-volatile memory device, a random access memory (RAM), etc.

One type of sensing device is a sense amplifier that operates under the principle of current detection. This type of sense amplifier determines the state of a cell within a memory device by detecting a difference in current through a bitline connected to a row comprising the cell. In this way, the state of the cell is represented as a modulation of the current flowing through it. Unfortunately, manufacturing variability, extrinsic effects such as externally induced noise, and other factors can reduce a size of a read window within which the sense amplifier operates to detect a current state of a cell. The read window is a range of values between two cell states, and becomes smaller as variability increases. Current techniques are unable to account for all the variability and extrinsic effects, which reduces the ability of such sense amplifiers to correctly determine a state of a cell. Current mirrors may be used by a sense amplifier to determine a state of a cell, but the current mirrors can contribute significantly to circuit variability due to transistor mismatch. Offset cancellation could be employed to reduce such circuit variability, but offset cancellation adds complexity, area, and increased power consumption. Further, the use of current mirrors can make current consumption prohibitively high in many use cases.

As provided herein, a level shifter device is configured with a first stage level shifter and a second stage level shifter. The first stage level shifter is configured to transform an input signal (e.g., an input signal from any type of circuitry/device, such as a processor, a sensor, a bitline of a memory cell, or any other type of logic or circuitry) to a first output signal. If the first stage level shifter utilizes a PMOS transistor, then the first output signal will have a voltage between a VPS control voltage and a ground. If the first stage level shifter utilizes an NMOS transistor, then the first output signal will have a voltage between a VDD supply voltage and a VNS control voltage.

The level shifter device comprises a second stage level shifter arranged subsequent to the first stage level shifter. The second stage level shifter is configured to transform the first output signal to a second output signal having a voltage between ground and the VDD supply voltage.

In an embodiment, the level shifter device may be configured to variably control a control voltage of the lever shifter device, such as the VPS control voltage and/or the VNS control voltage. The control voltage may be variably controlled during real-time operation based upon environmental factors, such as a temperature of a circuit/device using the level shifter device, a process variation, or a manufacturing tolerance of a wafer parameter. Variably controlling the control voltage will take into account the effect that the environment factors have on how transistors behave.

In an embodiment, the level shifter device may be connected to a bitline of a memory device, and is used as a sense amplifier. The bitline may be connected to a memory cell whose value is to be read from the memory cell. The level shifter device may be utilized to transform a voltage of the memory cell from a first voltage domain (e.g., a relatively lower voltage such as a voltage below 0.5*VDD) to a second voltage domain used to determine a value stored by the memory cell (e.g., a relatively higher voltage of a VDD domain, such as 1V). In this way, the level shifter device is used to amplify the voltage from the memory cell during the read operation.

In an embodiment, the level shifter device may be utilized as a sensing device comprising one or more sense amplifiers that operate within a time domain to determine a state of a cell within a memory device (e.g., a level shifter may be connected to the memory device in order to operate as a sense amplifier). Operation of the sensing device comprises a precharge phase, an integration phase, and a latching phase. During the precharge phase, certain components (e.g., a node, a gate of a transistor, a bitline, etc.) are precharged to determined voltages. During the integration phase, one or more switches are toggled so that a precharged bitline, connected to a cell to be read, will discharge through the bitline to create a sense amplifier output that is outputted to a latch. The time required for discharging the bitline is related to the state of the cell attached to the bitline. During a latching event, the latch is closed and a final value of the latch will depend on the sense amplifier output just before the latching event occurred, which in turn is a function of a bitline discharge current. The latch will toggle from one voltage value to another voltage value if the sense amplifier output is received by the latch before the latch is closed, otherwise, the voltage value will be retained within the latch. The state of the cell is determined based upon whether the value of the latch changed. It may be appreciated that various numbers and/or configurations of sense amplifiers may be employed.

This sensing device provides for lower mismatch and improves operation at lower supply voltage because current mirrors are not employed, in an embodiment. The sensing device reduces a number of critical transistors that could introduce mismatch because merely a single transistor may be a potential mismatch contributor. The sense amplifier consumes relatively less power during sensing and avoids read disruption of a cell's state even with low bitline/cell voltages. The sense amplifier is able to track and compensate for variability, such as process and temperature variations. Furthermore, the sense amplifier enables faster read speeds that is almost solely determined by a time constant of the memory device.

Figure 2:
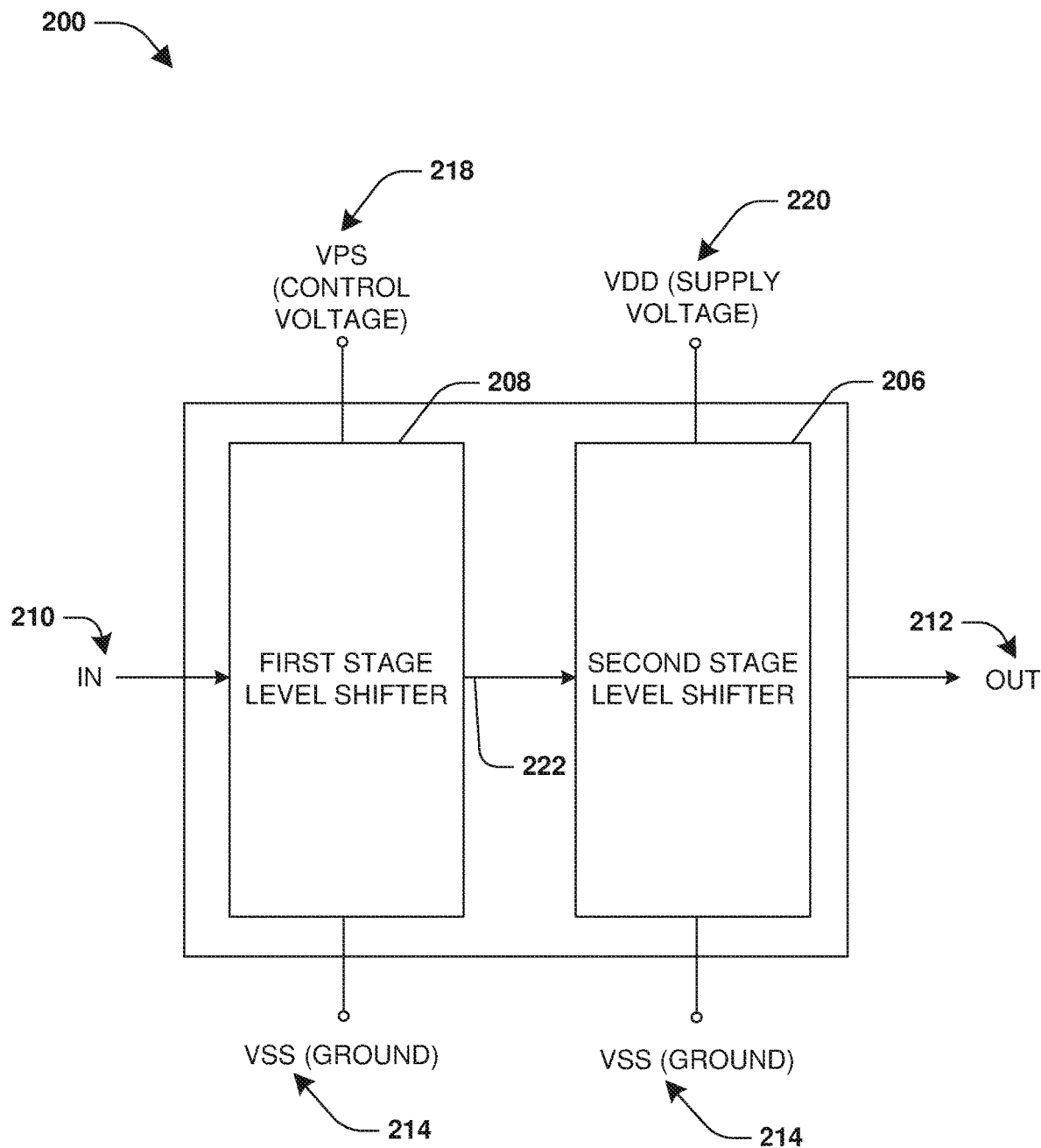
FIG. 2 is a component block diagram illustrating a level shifter in accordance with the techniques presented herein.
Figure 3:
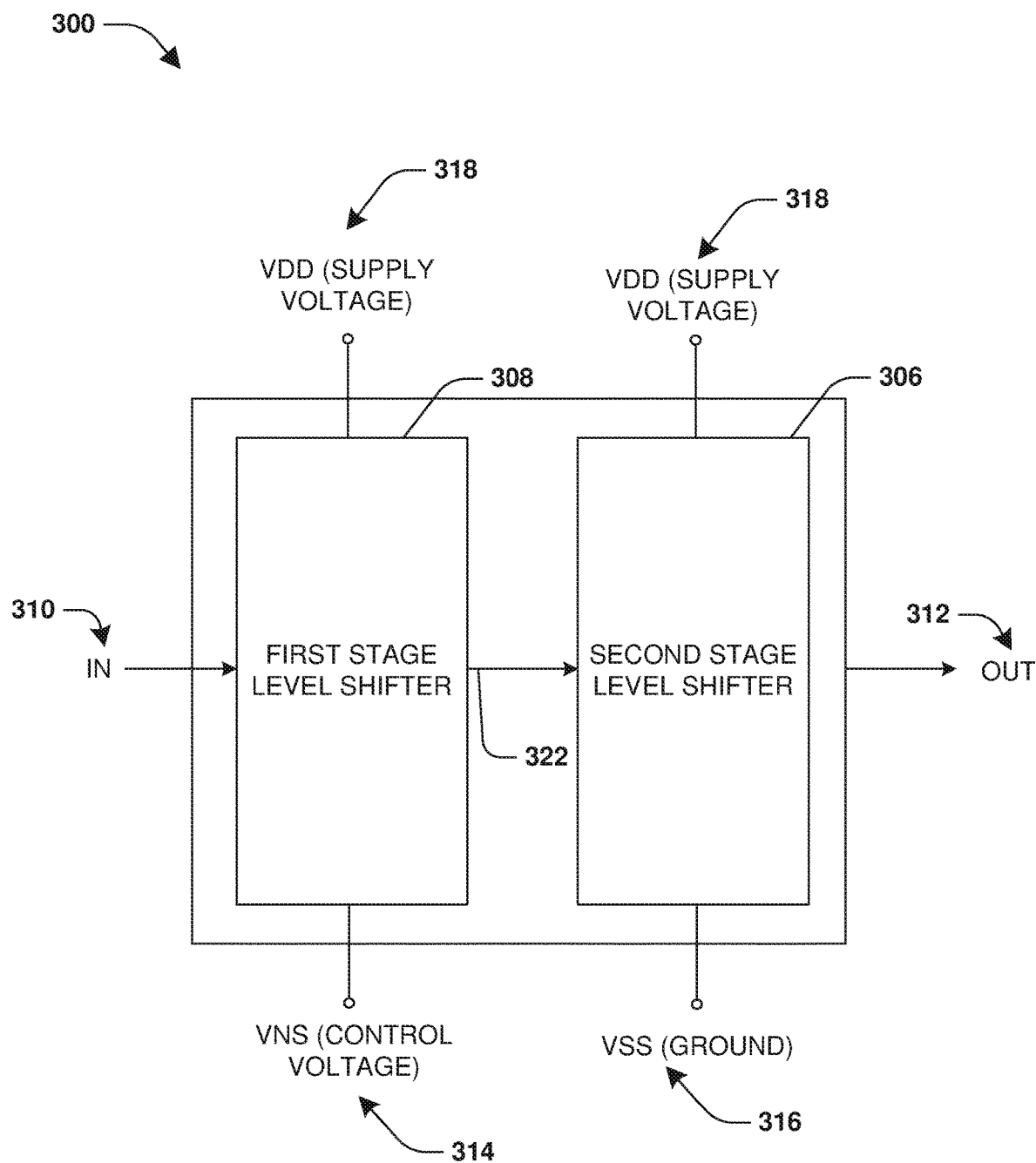
FIG. 3 is a component block diagram illustrating a level shifter in accordance with the techniques presented herein.

An embodiment of a level shifter device is illustrated by an exemplary method 100 of FIG. 1 and further described in conjunction with FIGS. 2-5. The level shifter device may be configured to transform an input signal from a first voltage domain into an output signal in a second voltage domain, such as by amplifying a voltage of the input signal. The level shifter device comprises a first stage level shifter and a second stage level shifter. FIG. 2 illustrates a level shifter device 200 according to a first configuration and FIG. 3 illustrates a level shifter device 300 according to a second configuration.

The level shifter device 200 of FIG. 2, having the first configuration, comprises a first stage level shifter 208 and a second stage level shifter 206. The first stage level shifter 208 is configured to transform an input signal from an input 210 (e.g., a bitline connected to a memory cell of a memory device, a connection to any other type of circuitry/devices/logic such as a processor, etc.) to a first output signal 222 having a voltage between a VPS control voltage 218 and a ground 214 (VSS ground), at 102. In an embodiment, the first stage level shifter 208 comprises a first transistor, such as a PMOS transistor, and a first device, such as an NMOS transistor, a register, or other device.

The second stage level shifter 206 is arranged subsequent to the first stage level shifter 208 such that the first output signal 222 is input into the second stage level shifter 206. The second stage level shifter 206 is configured to transform the first output signal 222 to a second output signal 212 having a voltage between the ground 214 and a VDD supply voltage 220, at 104. The second stage level shifter 206 comprises a second transistor, such as an NMOS transistor, and a second device, such as a PMOS transistor, a register, or other device.

Figure 5:
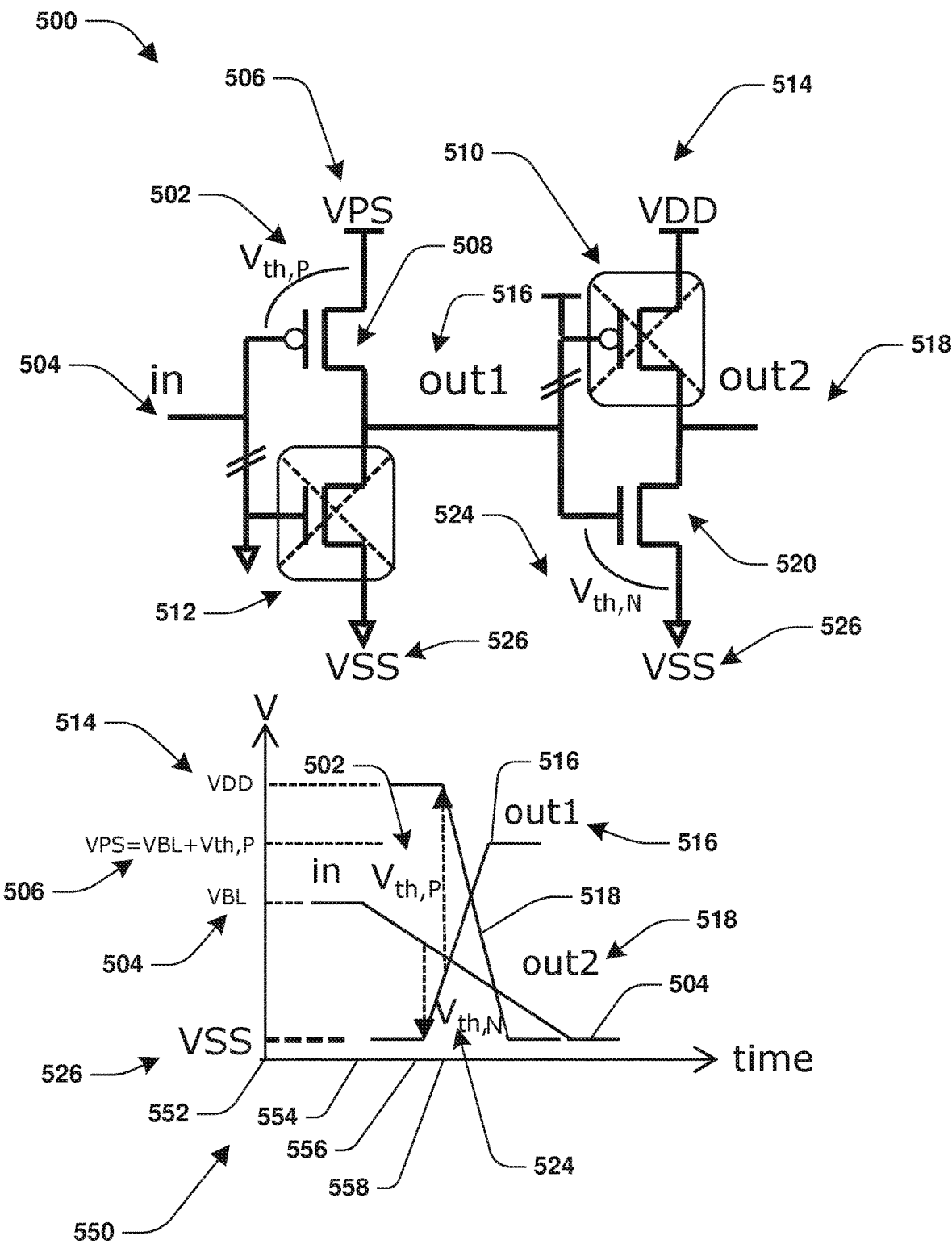
FIG. 5 is a component block diagram illustrating a level shifter and a timing diagram illustrating operation of the level shifter in accordance with the techniques presented herein.

FIG. 5 illustrates a level shifter device 500 that is an embodiment of the level shifter device 200 of FIG. 2 having the first configuration. The level shifter device 500 comprises a first stage level shifter comprising a first transistor 508 (e.g., a PMOS transistor) and a first device 512 (e.g., an NMOS transistor depicted within a box with a dashed X to represent that the first device 512 can be something other than the transistor depicted in FIG. 5). A gate of the first transistor 508 is connected to an input signal 504. A source of the first transistor 508 is connected to a VPS control voltage 506. A drain of the first transistor 508 is connected to a first node between the first transistor 508 and the first device 512. The first device 512 is connected to a first signal that when set to a first value (e.g., set high) allows precharging of a first output signal 516 to ground 526 (VSS ground). A series connection of the first transistor 508 and the first device 512 is connected between the VPS control voltage 506 and the ground 526. When a threshold voltage 502 (Vth,P) of the first transistor 508 is reached, the first transistor 508 outputs a first output signal 516 to the first node connected to a second stage level shifter. The second stage level shifter comprises a second transistor 520 (e.g., an NMOS transistor) and a second device 510 (e.g., a PMOS transistor depicted within a box with a dashed X to represent that the second device 510 can be something other than the transistor depicted in FIG. 5). In an embodiment, the VPS control voltage 506 is a positive voltage with regard to the ground 526.

In an embodiment, the second transistor 520 of the second stage level shifter comprises an NMOS transistor and the second device 510 comprises a PMOS transistor, a register, or other device. A gate of the second transistor 520 is connected to the first output signal 516. The second device 510 is connected to a second signal that when set of a second value (e.g., set low) allows for precharging of a second output signal 518 to the VDD supply voltage 514. A second node between the second transistor 520 and the second device 510 supplies the second output signal 518 such as when a threshold voltage 524 (Vth,N) is reached. A series connection of the second transistor 520 to the second device 510 is connected between the VDD supply voltage 514 and the ground 526.

The timing diagram 550 of FIG. 5 depicts an x-axis representing time and a y-axis representing voltage. At a first point in time 552, the input signal 504 (e.g., a VBL voltage corresponding to a voltage of a bitline) is between the VDD supply voltage 514 and the ground 526 and the VPS control voltage 506 is the sum of the input signal 504 (e.g., the VBL voltage) and the threshold voltage 502 (Vth,P) of the first transistor 508. At a second point in time 554, the input signal 504 starts to discharge to ground 526. At a third point in time 556 (e.g., when the threshold voltage 502 (Vth,P) is reached), the first output signal 516 goes from ground 526 to the VPS control voltage 506. At a fourth point in time 558 (e.g., when the threshold voltage 524 (Vth,N) is reached), the second output signal 518 goes from the VDD supply voltage 514 to ground 526.

In an embodiment, the VPS control voltage 506 (or VPS control voltage 218) is variably adjusted during operation based upon various factors. For example, the VPS control voltage 506 is variably adjusted based upon an environmental factor, such as based upon a temperature of the level shifter device 500 or circuitry surrounding the level shifter device 500, a process variation, or a manufacturing tolerance of a wafer parameter. The VPS control voltage 506 is variably adjusted to take into account how temperature affects the operation of transistors within the level shifter device 500. In an embodiment, the VPS control voltage 506 is adjusted to track a threshold voltage of a transistor within the level shifter device 500, such as the threshold voltage 502 (Vth,P). In an example, the threshold voltage 502 (Vth,P) is added to a voltage of the input signal 504 to obtain the VPS control voltage 506.

In an embodiment, the input of the level shifter device 500 is connected to a memory device. In an embodiment, the level shifter device 500 is connected to the memory device such that the level shifter device 500 may be used as a sense amplifier for the memory device. For example, the input of the level shifter device 500 may be connected to a bitline of the memory device. The bitline is connected to a memory cell that is to be read. Accordingly, the level shifter device 500 is used as a sense amplifier to transform a voltage of the input signal 504 from the memory cell from a voltage domain of the memory device (e.g., a relatively lower voltage) to another voltage domain (e.g., a relatively higher voltage) as the second output signal 518. The second output signal is output to a latch that is controlled by a reference sense amplifier to determine whether the memory cell stores a particular value in a time domain. If a reference signal from the reference sense amplifier falls faster than the second output signal 518 corresponding to the actual data being read from the memory cell, then the latch will be closed before the second output signal 518 can go through the latch. If the reference signal falls slower than the second output signal 518, then the second output signal 518 goes through the latch. In this way, a value stored by the memory cell can be detected based upon whether the second output signal 518 goes through the latch or not.

The level shifter device 300 of FIG. 3, having the second configuration, comprises a first stage level shifter 308 and a second stage level shifter 306. The first stage level shifter 308 is configured to transform an input signal from an input 310 (e.g., a bitline connected to a memory cell of a memory device, a connection to any other type of circuitry/devices/logic such as a processor, etc.) to a first output signal 322 having a voltage between a VDD supply voltage 318 and a VNS control voltage 314, at 102. In an embodiment, the first stage level shifter 308 comprises a first transistor, such as an NMOS transistor, and a first device, such as a PMOS transistor, a register, or other device.

The second stage level shifter 306 is arranged subsequent to the first stage level shifter 308 such that the first output signal 322 is input into the second stage level shifter 306. The second stage level shifter 306 is configured to transform the first output signal 322 to a second output signal 312 having a voltage between the ground 316 and a VDD supply voltage 318, at 104. The second stage level shifter 306 comprises a second transistor, such as a PMOS transistor, and a second device, such as an NMOS transistor, a register, or other device.

Figure 4:
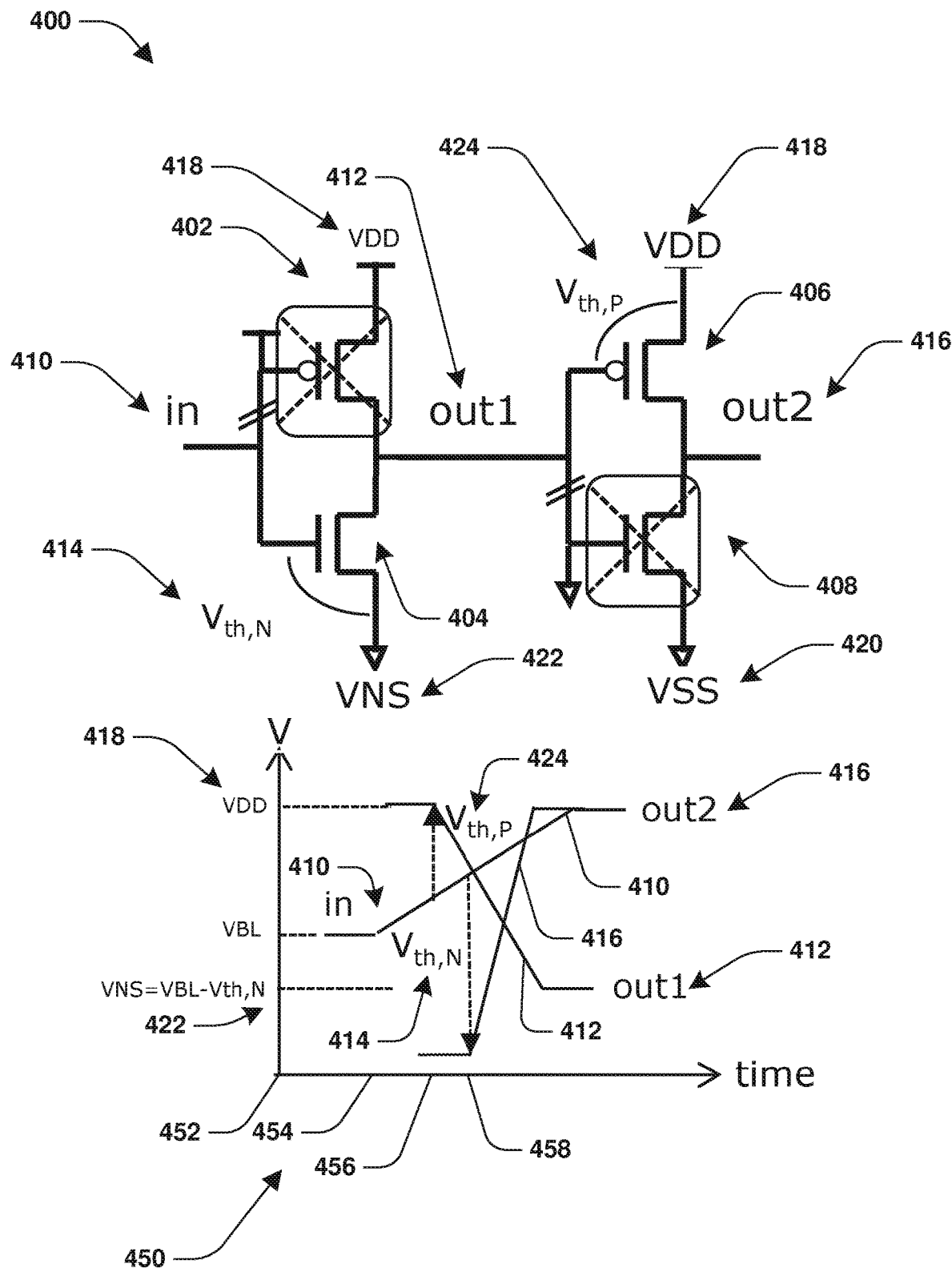
FIG. 4 is a component block diagram illustrating a level shifter and a timing diagram illustrating operation of the level shifter in accordance with the techniques presented herein.

FIG. 4 illustrates a level shifter device 400 that is an embodiment of the level shifter device 300 of FIG. 3 having the first configuration. The level shifter device 400 comprises a first stage level shifter comprising a first transistor 404 (e.g., an NMOS transistor) and a first device 402 (e.g., a PMOS transistor depicted within a box with a dashed X to represent that the first device 402 can be something other than the transistor depicted in FIG. 4). A gate of the first transistor 404 is connected to the input signal 410. The first transistor 404 is connected to a first node between the first transistor 404 and the first device 402. The first transistor 404 is connected to a VNS control voltage 422. The first device 402 is connected to a first signal that when set to a first value allows precharging of a first output signal 412 to the VDD supply voltage 418. A series connection of the first transistor 404 and the first device 402 is connected between the VDD supply voltage 418 and the VNS control voltage 422. When a threshold voltage 414 (Vth,N) of the first transistor 404 is reached, the first transistor 404 outputs the first output signal 412 to the first node connect to a second stage level shifter. The second stage level shifter comprises a second transistor 406 (e.g., a PMOS transistor) and a second device 408 (e.g., an NMOS transistor depicted within a box with a dashed X to represent that the second device 408 can be something other than the transistor depicted in FIG. 4).

In an embodiment, the second transistor 406 of the second stage level shifter comprises a PMOS transistor and the second device 408 comprises an NMOS transistor, a register, or other device. A gate of the second transistor 406 is connected to the first output signal 412. The second device 408 is connected to a second signal that when set to a second value allows for precharging of a second output signal 416 to ground 420. A second node between the second transistor 406 and the second device 408 supplies the second output signal 416 such as when a threshold voltage 424 (Vth,P) is reached. A series connection of the second transistor 406 to the second device 408 is connected between the VDD supply voltage 418 and the ground 420.

The timing diagram 450 of FIG. 4 depicts an x-axis representing time and a y-axis representing voltage. At a first point in time 452, the input signal 410 (e.g., a VBL voltage corresponding to a voltage of a bitline) is between the VDD supply voltage 418 and the VNS control voltage 422 and the VNS control voltage 422 is the difference between the input signal 410 (e.g., the VBL voltage) and the threshold voltage 414 (Vth,N) of the first transistor 404. At a second point in time 454, the input signal 410 starts to transition to the VDD supply voltage 418. At a third point in time 456 (e.g., when the threshold voltage 414 (Vth,N) is reached), the first output signal 412 transitions from the VDD supply voltage 418 to the VNS control voltage 422. At a fourth point in time 458 (e.g., when the threshold voltage 424 (Vth,P) is reached), the second output signal 416 goes from ground 420 to the VDD supply voltage 418.

In an embodiment, the VNS control voltage 422 (or VNS control voltage 314) is variably adjusted during operation based upon various factors. For example, the VNS control voltage 422 is variably adjusted based upon an environmental factor, such as based upon a temperature of the level shifter device 400 or circuitry surrounding the level shifter device 400, a process variation, or a manufacturing tolerance of a wafer parameter. The VNS control voltage 422 is variably adjusted to take into account how temperature affects the operation of transistors within the level shifter device 400. In an embodiment, the VNS control voltage 422 is adjusted to track a threshold voltage of a transistor within the level shifter device 400, such as the threshold voltage 414 (Vth,N). In an example where the transistor is an NMOS transistor and the VNS control voltage 422 is less than the VDD supply voltage 418, the threshold voltage 414 (Vth,N) is subtracted from a voltage of the input signal 410 to obtain the VNS control voltage 422.

In an embodiment, the input of the level shifter device 400 is connected to a memory device. In an embodiment, the level shifter device 400 is connected to the memory device such that the level shifter device 400 may be used as a sense amplifier for the memory device. For example, the input of the level shifter device 400 may be connected to a bitline of the memory device. The bitline is connected to a memory cell that is to be read. Accordingly, the level shifter device 400 is used as a sense amplifier to transform a voltage of the input signal 410 from the memory cell from a voltage domain of the memory device (e.g., a relatively lower voltage) to another voltage domain (e.g., a relatively higher voltage) as the second output signal 416 that is output to a latch that is controlled by a reference sense amplifier to determine whether the memory cell stores a particular value in a time domain. If a reference signal from the reference sense amplifier falls faster than the second output signal 416 corresponding to the actual data being read from the memory cell, then the latch will be closed before the second output signal 416 can go through the latch. If the reference signal falls slower than the second output signal 416, then the second output signal 416 goes through the latch. In this way, a value stored by the memory cell can be detected based upon whether the second output signal 416 goes through the latch or not.

Still another embodiment involves a computer-readable medium comprising processor-executable instructions configured to apply the techniques presented herein. Such computer-readable media may include various types of communications media, such as a signal that may be propagated through various physical phenomena (e.g., an electromagnetic signal, a sound wave signal, or an optical signal) and in various wired scenarios (e.g., via an Ethernet or fiber optic cable) and/or wireless scenarios (e.g., a wireless local area network (WLAN) such as WiFi, a personal area network (PAN) such as Bluetooth, or a cellular or radio network), and which encodes a set of computer-readable instructions that, when executed by a processor of a device, cause the device to implement the techniques presented herein. Such computer-readable media may also include (as a class of technologies that excludes communications media) computer-readable memory devices, such as a memory semiconductor (e.g., a semiconductor utilizing static random access memory (SRAM), dynamic random access memory (DRAM), and/or synchronous dynamic random access memory (SDRAM) technologies), a platter of a hard disk drive, a flash memory device, or a magnetic or optical disc (such as a CD-R, DVD-R, or floppy disc), encoding a set of computer-readable instructions that, when executed by a processor of a device, cause the device to implement the techniques presented herein.

Figure 6:
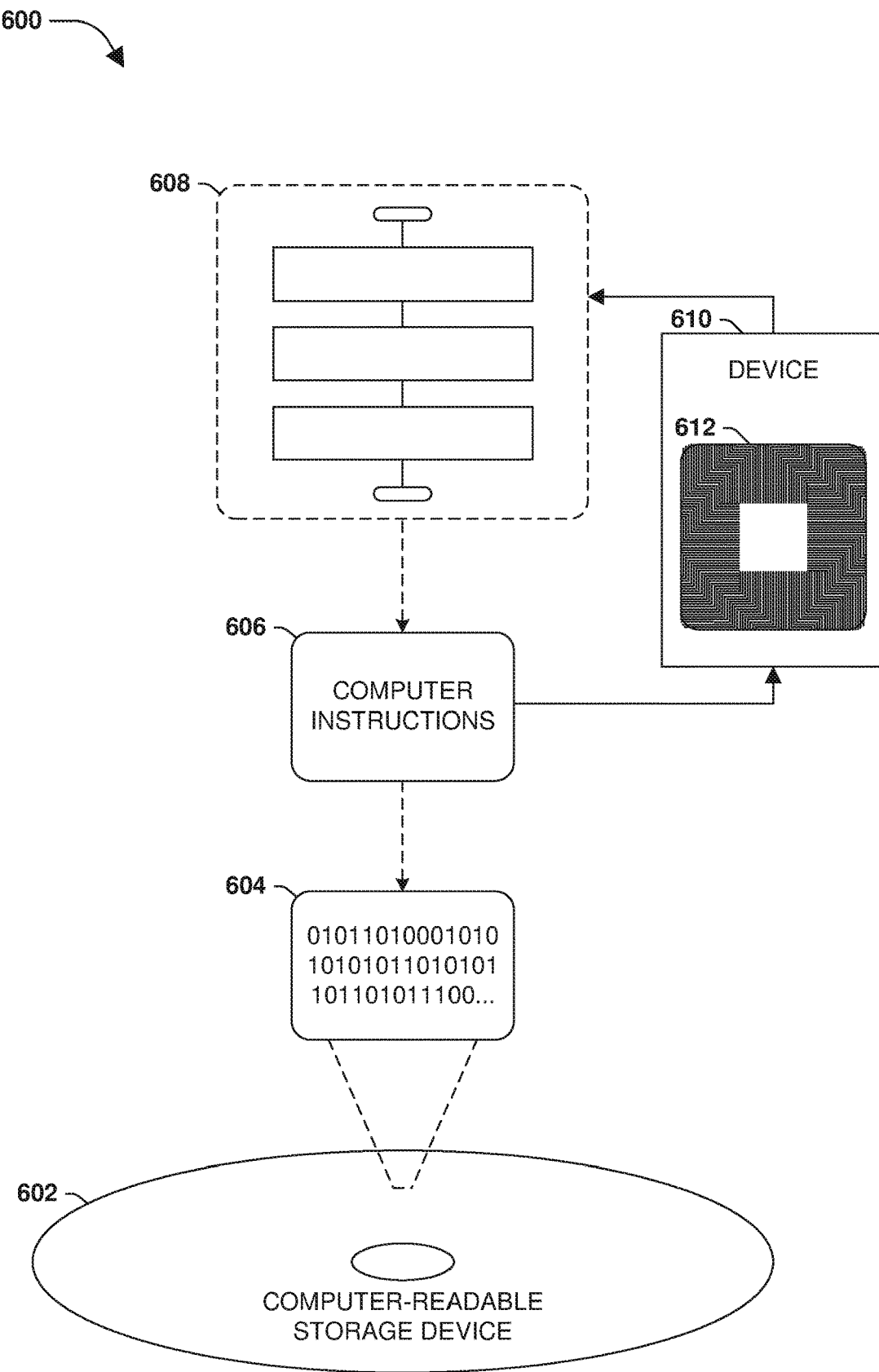
FIG. 6 is an example of a computer readable medium in which at least a portion of the currently presented techniques may be utilized.

An example computer-readable medium that may be devised in these ways is illustrated in FIG. 6, wherein the implementation 600 comprises a computer-readable memory device 602 (e.g., a CD-R, DVD-R, or a platter of a hard disk drive), on which is encoded computer-readable data 604. This computer-readable data 604 in turn comprises a set of computer instructions 606 that, when executed on a processor 612 of a device 610, provide an embodiment that causes the device 610 to operate according to the techniques presented forth herein. Many such computer-readable media may be devised by those of ordinary skill in the art that are configured to operate in accordance with the techniques presented herein. In some embodiments, the processor-executable computer instructions 606 are configured to perform a method 608, such as at least some of the exemplary method 100 of FIG. 1, for example. In some embodiments, the processor-executable computer instructions 604 are configured to implement a system, such as at least some of the exemplary level shifter device 200 of FIG. 2, at least some of the exemplary level shifter 300 of FIG. 3, at least some of the exemplary level shifter device 400 of FIG. 4, and/or at least some of the exemplary level shifter device 500 of FIG. 5, for example. Many such computer-readable media are contemplated to operate in accordance with the techniques presented herein.

Figure 7:
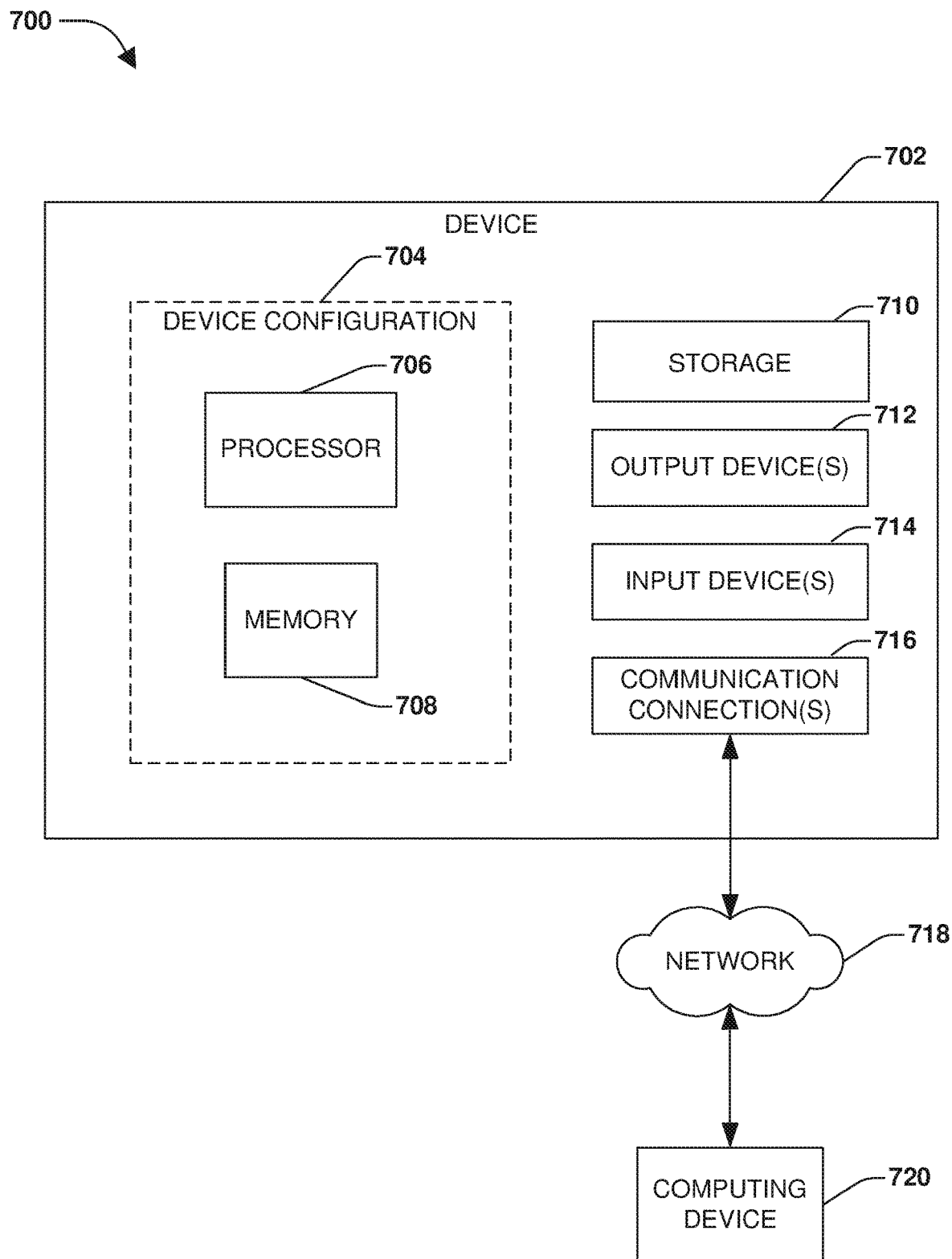
FIG. 7 is an illustration of an example computing environment wherein at least a portion of the currently presented techniques may be utilized.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, without limitation, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 7 illustrates an example 700 of a system comprising a computing device 702 configured to implement one or more embodiments provided herein. In one configuration, computing device 702 includes a processing unit 706 and memory 708. Depending on the exact configuration and type of computing device, memory 708 may be volatile (such as RAM, for example), non-volatile (such as ROM, flash memory, etc., for example), or some combination of the two. This configuration is illustrated in FIG. 7 by dashed line 704.

As provided herein, a sensing device can be employed for the memory 708 and/or storage 710 in order to improve the accuracy of reading cells within the memory 708 and/or the storage 710.

In some embodiments, device 702 may include additional features and/or functionality. For example, device 702 may also include additional storage (e.g., removable and/or non-removable) including, without limitation, magnetic storage, optical storage, and the like. Such additional storage is illustrated in FIG. 7 by storage 710. In one embodiment, computer readable instructions to implement one or more embodiments provided herein may be in storage 710. Storage 710 may also store computer readable instructions to implement an operating system, an application program, and the like. Computer readable instructions may be loaded in memory 708 for execution by processing unit 706, for example.

The term "computer readable media" as used herein includes computer storage media. Computer storage media includes volatile and nonvolatile, removable and non-removable media implemented in any method or technology for storage of information such as computer readable instructions or other data. Memory 708 and storage 710 are examples of computer storage media. Computer storage media includes, without limitation, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 702. Any such computer storage media may be part of device 702.

Device 702 may also include communication connection(s) 716 that allows device 702 to communicate with other devices. Communication connection(s) 716 may include, without limitation, a modem, a Network Interface Card (NIC), an integrated network interface, a radio frequency transmitter/receiver, an infrared port, a USB connection, or other interfaces for connecting device 702 to other computing devices. Communication connection(s) 716 may include a wired connection or a wireless connection. Communication connection(s) 716 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 702 may include input device(s) 714 such as keyboard, mouse, pen, voice input device, touch input device, infrared cameras, video input devices, and/or any other input device. Output device(s) 712 such as one or more displays, speakers, printers, and/or any other output device may also be included in device 702. Input device(s) 714 and output device(s) 712 may be connected to device 702 via a wired connection, wireless connection, or any combination thereof. In one embodiment, an input device or an output device from another computing device may be used as input device(s) 714 or output device(s) 712 for computing device 702.

Components of device 702 may be connected by various interconnects, such as a bus. Such interconnects may include a Peripheral Component Interconnect (PCI), such as PCI Express, a Universal Serial Bus (USB), Firewire (IEEE 794), an optical bus structure, and the like. In an embodiment, components of device 702 may be interconnected by a network. For example, memory 708 may be comprised of multiple physical memory units located in different physical locations interconnected by a network.

Those skilled in the art will realize that storage devices utilized to store computer readable instructions may be distributed across a network. For example, a computing device 720 accessible via network 718 may store computer readable instructions to implement one or more embodiments provided herein. Computing device 702 may access the computing device 720 and download a part or all of the computer readable instructions for execution. Alternatively, computing device 702 may download pieces of the computer readable instructions, as needed, or some instructions may be executed at computing device 702 and some at computing device 720.

An embodiment of the presently disclosed techniques comprises a level shifter device. The level shifter device comprises a first stage level shifter configured to transform an input signal, from a bitline connected to at least one memory cell of a memory device, to a first output signal having a voltage between at least one of a VPS control voltage and a ground or a VDD supply voltage and a VNS control voltage; and a second stage level shifter arranged subsequent to the first stage level shifter and configured to transform the first output signal to a second output signal having a voltage between the ground and the VDD supply voltage.

According to some embodiments, the level shifter device is part of a sense amplifier configured to determine the state of memory cells of the memory device.

According to some embodiments, the first stage level shifter comprises a first transistor and a first device, wherein a gate of the first transistor is connected to the input signal, wherein the first device is connected to a first signal that when set to a first value allows precharging of the first output signal to ground, wherein a first node between the first transistor and the first device supplies the first output signal, and wherein a series connection of the first transistor and the first device is connected between the VPS control voltage and the ground.

According to some embodiments, the first transistor comprises a PMOS transistor and the first device comprises an NMOS transistor.

According to some embodiments, the second stage level shifter comprises a second transistor and a second device, wherein a gate of the second transistor is connected to the first output signal and the second device is connected to a second signal that when set to a second value allows precharging of the second output signal to the VDD supply voltage, wherein a second node between the second transistor and the second device supplies the second output signal, and wherein a series connection of the second transistor and the second device is connected between the VDD supply voltage and the ground.

According to some embodiments, the second transistor comprises an NMOS transistor and the second device comprises a PMOS transistor.

According to some embodiments, the first stage level shifter comprises a first transistor and a first device, wherein a gate of the first transistor is connected to the input signal, wherein the first device is connected to a first signal that when set to a first value allows precharging of the first output signal to the VDD supply voltage, wherein a first node between the first transistor and the first device supplies the first output signal, and wherein a series connection of the first transistor and the first device is connected between the VDD supply voltage and the VNS control voltage.

According to some embodiments, the first transistor comprises an NMOS transistor and the first device comprises a PMOS transistor.

According to some embodiments, the second stage level shifter comprises a second transistor and a second device, wherein a gate of the second transistor is connected to the first output signal and the second device is connected to a second signal that when set to a second value allows precharging of the second output signal to the VDD supply voltage, wherein a second node between the second transistor and the second device supplies the second output signal, and wherein a series connection of the second transistor and the second device is connected between the VDD supply voltage and the ground.

According to some embodiments, the second transistor comprises a PMOS transistor and the second device comprises an NMOS transistor.

According to some embodiments, the memory device comprises a random access memory (RAM) device.

An embodiment of the presently disclosed techniques comprises a level shifter device. The level shifter device comprises a first stage level shifter configured to transform an input signal to a first output signal having a voltage between at least one of a VPS control voltage and a ground or a VDD supply voltage and a VNS control voltage; and a second stage level shifter arranged subsequent to the first stage level shifter and configured to transform the first output signal to a second output signal having a voltage between the ground and the VDD supply voltage, wherein at least one of the VPS control voltage or the VNS control voltage is variably adjusted.

According to some embodiments, at least one of the VPS control voltage or the VNS control voltage is variably adjusted based upon at least one of an environmental factor, a process variation, or a manufacturing tolerance of a wafer parameter.

According to some embodiments, at least one of the VPS control voltage or the VNS control voltage is variably adjusted based upon a temperature.

According to some embodiments, the first stage level shifter comprises at least one transistor, and wherein at least one of the VPS control voltage or the VNS control voltage tracks a threshold voltage of the at least one transistor.

According to some embodiments, the threshold voltage is added to or subtracted from the input signal to obtain at least one of the VPS control voltage or the VNS control voltage.

According to some embodiments, the first stage level shifter comprises a PMOS transistor and the second stage level shifter comprises an NMOS transistor, and wherein the VPS control voltage is a positive voltage with regard to the ground.

According to some embodiments, the first stage level shifter comprises an NMOS transistor and the second stage level shifter comprises a PMOS transistor.

An embodiment of the presently disclosed techniques comprises a method. The method comprises controlling a first stage level shifter to transform an input signal to output a first output signal having a voltage between at least one of a VPS control voltage and a ground or a VDD supply voltage and a VNS control voltage; and controlling a second stage level shifter, arranged subsequent to the first stage level shifter, to transform the first output signal to a second output signal having a voltage between the ground and the VDD supply voltage.

According to some embodiments, the input signal is received from a bitline connected to at least one memory cell of a memory device.

According to some embodiments, the method comprises variably adjusting at least one of the VPS control voltage or the VNS control voltage based upon at least one of an environmental factor, a process variation, or a manufacturing tolerance of a wafer parameter.

According to some embodiments, the first stage level shifter comprises a first transistor and a first device, wherein a gate of the first transistor is connected to the input signal, wherein the first device is connected to a first signal that when set to a first value allows precharging of the first output signal to ground, wherein a first node between the first transistor and the first device supplies the first output signal, and wherein a series connection of the first transistor and the first device is connected between the VPS control voltage and the ground.

According to some embodiments, the second stage level shifter comprises a second transistor and a second device, wherein a gate of the second transistor is connected to the first output signal and the second device is connected to a second signal that when set to a second value allows precharging of the second output signal to the VDD supply voltage, wherein a second node between the second transistor and the second device supplies the second output signal, and wherein a series connection of the second transistor and the second device is connected between the VDD supply voltage and the ground.

According to some embodiments, the first stage level shifter comprises a first transistor and a first device, wherein a gate of the first transistor is connected to the input signal, wherein the first device is connected to a first signal that when set to a first value allows precharging of the first output signal to the VDD supply voltage, wherein a first node between the first transistor and the first device supplies the first output signal, and wherein a series connection of the first transistor and the first device is connected between the VDD supply voltage and the VNS control voltage.

According to some embodiments, the second stage level shifter comprises a second transistor and a second device, wherein a gate of the second transistor is connected to the first output signal and the second device is connected to a second signal that when set to a second value allows precharging of the second output signal to the VDD supply voltage, wherein a second node between the second transistor and the second device supplies the second output signal, and wherein a series connection of the second transistor and the second device is connected between the VDD supply voltage and the ground.

An embodiment of the presently disclosed techniques comprises an apparatus, comprising a means for controlling a first stage level shifter to transform an input signal to output a first output signal having a voltage between at least one of a VPS control voltage and a ground or a VDD supply voltage and a VNS control voltage; and a means for controlling a second stage level shifter, arranged subsequent to the first stage level shifter, to transform the first output signal to a second output signal having a voltage between the ground and the VDD supply voltage.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A level shifter device, comprising:
   a first stage level shifter configured to transform an input signal, from a bitline connected to at least one memory cell of a memory device, to a first output signal having a voltage between at least one of a VPS control voltage and a ground or a VDD supply voltage and a VNS control voltage; and
   a second stage level shifter arranged subsequent to the first stage level shifter and configured to transform the first output signal to a second output signal having a voltage between the ground and the VDD supply voltage.

2. The level shifter device of claim 1, wherein the level shifter device is part of a sense amplifier configured to determine the state of memory cells of the memory device.

3. The level shifter device of claim 1, wherein the first stage level shifter comprises a first transistor and a first device, wherein a gate of the first transistor is connected to the input signal, wherein the first device is connected to a first signal that when set to a first value allows precharging of the first output signal to ground, wherein a first node between the first transistor and the first device supplies the first output signal, and wherein a series connection of the first transistor and the first device is connected between the VPS control voltage and the ground.

4. The level shifter device of claim 3, wherein the first transistor comprises a PMOS transistor and the first device comprises an NMOS transistor.

5. The level shifter device of claim 3, wherein the second stage level shifter comprises a second transistor and a second device, wherein a gate of the second transistor is connected to the first output signal and the second device is connected to a second signal that when set to a second value allows precharging of the second output signal to the VDD supply voltage, wherein a second node between the second transistor and the second device supplies the second output signal, and wherein a series connection of the second transistor and the second device is connected between the VDD supply voltage and the ground.

6. The level shifter device of claim 5, wherein the second transistor comprises an NMOS transistor and the second device comprises a PMOS transistor.

7. The level shifter device of claim 1, wherein the first stage level shifter comprises a first transistor and a first device, wherein a gate of the first transistor is connected to the input signal, wherein the first device is connected to a first signal that when set to a first value allows precharging of the first output signal to the VDD supply voltage, wherein a first node between the first transistor and the first device supplies the first output signal, and wherein a series connection of the first transistor and the first device is connected between the VDD supply voltage and the VNS control voltage.

8. The level shifter device of claim 7, wherein the first transistor comprises an NMOS transistor and the first device comprises a PMOS transistor.

9. The level shifter device of claim 7, wherein the second stage level shifter comprises a second transistor and a second device, wherein a gate of the second transistor is connected to the first output signal and the second device is connected to a second signal that when set to a second value allows precharging of the second output signal to the VDD supply voltage, wherein a second node between the second transistor and the second device supplies the second output signal, and wherein a series connection of the second transistor and the second device is connected between the VDD supply voltage and the ground.

10. The level shifter device of claim 9, wherein the second transistor comprises a PMOS transistor and the second device comprises an NMOS transistor.

11. The level shifter device of claim 1, wherein the memory device comprises a random access memory (RAM) device.

12. A level shifter device, comprising:
    a first stage level shifter configured to transform an input signal to a first output signal having a voltage between at least one of a VPS control voltage and a ground or a VDD supply voltage and a VNS control voltage; and
    a second stage level shifter arranged subsequent to the first stage level shifter and configured to transform the first output signal to a second output signal having a voltage between the ground and the VDD supply voltage, wherein at least one of the VPS control voltage or the VNS control voltage is variably adjusted.

13. The level shifter device of claim 12, wherein at least one of the VPS control voltage or the VNS control voltage is variably adjusted based upon at least one of an environmental factor, a process variation, or a manufacturing tolerance of a wafer parameter.

14. The level shifter device of claim 12, wherein at least one of the VPS control voltage or the VNS control voltage is variably adjusted based upon a temperature.

15. The level shifter device of claim 12, wherein the first stage level shifter comprises at least one transistor, and wherein at least one of the VPS control voltage or the VNS control voltage tracks a threshold voltage of the at least one transistor.

16. The level shifter device of claim 15, wherein the threshold voltage is added to or subtracted from the input signal to obtain at least one of the VPS control voltage or the VNS control voltage.

17. The level shifter device of claim 12, wherein the first stage level shifter comprises a PMOS transistor and the second stage level shifter comprises an NMOS transistor, and wherein the VPS control voltage is a positive voltage with regard to the ground.

18. The level shifter device of claim 12, wherein the first stage level shifter comprises an NMOS transistor and the second stage level shifter comprises a PMOS transistor.

19. A method, comprising:
controlling a first stage level shifter to transform an input signal to output a first output signal having a voltage between at least one of a VPS control voltage and a ground or a VDD supply voltage and a VNS control voltage; and
controlling a second stage level shifter, arranged subsequent to the first stage level shifter, to transform the first output signal to a second output signal having a voltage between the ground and the VDD supply voltage.

20. The method of claim 19, wherein the input signal is received from a bitline connected to at least one memory cell of a memory device.

21. The method of claim 19, comprising:
variably adjusting at least one of the VPS control voltage or the VNS control voltage based upon at least one of an environmental factor, a process variation, or a manufacturing tolerance of a wafer parameter.

22. The method of claim 19, wherein the first stage level shifter comprises a first transistor and a first device, wherein a gate of the first transistor is connected to the input signal, wherein the first device is connected to a first signal that when set to a first value allows precharging of the first output signal to ground, wherein a first node between the first transistor and the first device supplies the first output signal, and wherein a series connection of the first transistor and the first device is connected between the VPS control voltage and the ground.

23. The method of claim 22, wherein the second stage level shifter comprises a second transistor and a second device, wherein a gate of the second transistor is connected to the first output signal and the second device is connected to a second signal that when set to a second value allows precharging of the second output signal to the VDD supply voltage, wherein a second node between the second transistor and the second device supplies the second output signal, and wherein a series connection of the second transistor and the second device is connected between the VDD supply voltage and the ground.

24. The method of claim 19, wherein the first stage level shifter comprises a first transistor and a first device, wherein a gate of the first transistor is connected to the input signal, wherein the first device is connected to a first signal that when set to a first value allows precharging of the first output signal to the VDD supply voltage, wherein a first node between the first transistor and the first device supplies the first output signal, and wherein a series connection of the first transistor and the first device is connected between the VDD supply voltage and the VNS control voltage.

25. The method of claim 24, wherein the second stage level shifter comprises a second transistor and a second device, wherein a gate of the second transistor is connected to the first output signal and the second device is connected to a second signal that when set to a second value allows precharging of the second output signal to the VDD supply voltage, wherein a second node between the second transistor and the second device supplies the second output signal, and wherein a series connection of the second transistor and the second device is connected between the VDD supply voltage and the ground.

\* \* \* \* \*